US009407296B2

(12) United States Patent
Rajapandian et al.

(10) Patent No.: US 9,407,296 B2
(45) Date of Patent: Aug. 2, 2016

(54) LOW NOISE, PROGRAMMABLE GAIN CURRENT BUFFER

(71) Applicant: MEDIATEK INC., Hsin-Chu (TW)

(72) Inventors: Saravanan Rajapandian, Austin, TX (US); Caiyi Wang, Austin, TX (US); Jing Li, Austin, TX (US); Ravikanth Suravarapu, Austin, TX (US); Narayanan Baskaran, Austin, TX (US)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/044,079

(22) Filed: Feb. 15, 2016

(65) Prior Publication Data

US 2016/0164546 A1    Jun. 9, 2016

Related U.S. Application Data

(62) Division of application No. 14/465,841, filed on Aug. 22, 2014, now Pat. No. 9,300,264.

(51) Int. Cl.
| | | |
|---|---|---|
| *H04B 7/00* | (2006.01) | |
| *H04B 1/40* | (2015.01) | |
| *H04B 1/00* | (2006.01) | |
| *H04L 5/12* | (2006.01) | |

(Continued)

(52) U.S. Cl.
CPC ............. *H04B 1/005* (2013.01); *H03G 3/3036* (2013.01)

(58) Field of Classification Search
CPC ......... H03G 3/3036; H03G 3/30; H04B 7/00; H04B 1/40; H04B 1/00; H04L 5/12; H04W 88/12; H03D 7/1441; H03D 7/1458; H03D 7/1466; H03D 2200/0025; H03D 2200/0033; H03D 2200/0043; H03D 2200/0088; G06F 7/44

See application file for complete search history.

(56) References Cited

U.S. PATENT DOCUMENTS

| | | | |
|---|---|---|---|
| 6,615,027 B1 * | 9/2003 | Sahota | ............... G06J 1/00 341/126 |
| 6,990,326 B2 | 1/2006 | Otaka | |

(Continued)

FOREIGN PATENT DOCUMENTS

| | | |
|---|---|---|
| EP | 1 213 844 A1 | 6/2002 |
| EP | 2 393 208 A2 | 12/2011 |

OTHER PUBLICATIONS

Mikhemar, A 13.5mA Sub-2.5dB NF Multi-Band Receiver, pp. 82-83, 2012 Symposium on VLSI Circuits Digest of Technical Papers.

(Continued)

*Primary Examiner* — Pablo Tran
(74) *Attorney, Agent, or Firm* — Winston Hsu; Scott Margo

(57) ABSTRACT

A current buffer used in a receiver arrangement includes a direct path mode and a mirror path mode. The direct path mode includes a plurality of first set of transistors and a plurality of first set of current sources turned on while all remaining transistors and current sources are turned off, during the direct path mode a current signal at an input node directly appears at an output node. The mirror path mode includes a first transistor and a first current source being turned off while a plurality of second set of transistors and a plurality of second set of current sources are turned on. The current signal goes through a current mirror pair and appears at the output node with a gain which is controlled by slicing one of transistors of the current mirror pair and a second current source allowing multiple gains in the mirror path mode.

3 Claims, 4 Drawing Sheets

(51) Int. Cl.
*H04W 88/12* (2009.01)
*H03G 3/30* (2006.01)

(56) References Cited

U.S. PATENT DOCUMENTS

| | | | |
|---|---|---|---|
| 7,215,160 B2 * | 5/2007 | Liu | H03F 3/005 |
| | | | 327/560 |
| 7,336,126 B2 * | 2/2008 | Donig | H03F 1/22 |
| | | | 330/252 |
| 7,375,577 B2 * | 5/2008 | Lin | H03D 7/1441 |
| | | | 327/351 |
| 8,222,954 B1 * | 7/2012 | Ren | H03K 19/00369 |
| | | | 323/312 |
| 8,233,871 B2 | 7/2012 | Keehr | |
| 8,452,241 B2 | 5/2013 | Haralabidis | |
| 8,457,580 B2 | 6/2013 | Mikhemar | |
| 8,611,466 B2 | 12/2013 | Lee | |
| 9,088,471 B1 | 7/2015 | Kim | |
| 9,099,975 B2 * | 8/2015 | Yahav | H03G 3/30 |
| 9,184,707 B2 | 11/2015 | Rangarajan | |
| 2004/0169565 A1 | 9/2004 | Gaggl | |
| 2006/0038610 A1 | 2/2006 | Gudem | |
| 2008/0139143 A1 | 6/2008 | Roufoogaran | |
| 2010/0291881 A1 | 11/2010 | Brunn | |
| 2012/0021712 A1 | 1/2012 | Mikhemar | |
| 2012/0098506 A1 | 4/2012 | Hu | |
| 2012/0170694 A1 | 7/2012 | Lee | |
| 2013/0231064 A1 | 9/2013 | Gudem | |
| 2014/0072001 A1 | 3/2014 | Chang | |
| 2014/0134960 A1 | 5/2014 | Tasic | |
| 2014/0197886 A1 | 7/2014 | Rangarajan | |
| 2014/0266886 A1 | 9/2014 | Wang | |

OTHER PUBLICATIONS

Hoai-Nam Nguyen et al., A Low Power Discrete-Time Receiver for Triple-Band FM/T-DMB/DAB System-on-Chip, 2011, pp. 311-314, XP031976408, IEEE.

* cited by examiner

LOW NOISE, PROGRAMMABLE GAIN CURRENT BUFFER

CROSS REFERENCE TO RELATED APPLICATION

This divisional application claims the benefit of co-pending U.S. patent application Ser. No. 14/465,841, filed on Aug. 22, 2014 and incorporated herein by reference.

BACKGROUND

The invention is related to the field of communication systems, and in particular to a multimode multiband receiver.

The present generation cellular phones need to support multiple modes (GSM/GPRS/EDGE, WCDMA/HSDPA/HSPA+, TDSCDMA, LTE-TDD/FDD/BW=1.4 MHz to 20 MHz) and multiple bands for worldwide operability. This adds enormous complexity in the receiver front end design and also introduces the need to have a highly programmable analog filter to optimize the analog-digital-converter (ADC) dynamic range across various modes and thus save power consumption. Also, the need to support BW>10 MHz for LTE with higher order modulations (64QAM) adds stringent requirements on the Image Rejection (IR) of the receiver.

SUMMARY

According to one aspect of the invention, there is provided a receiver arrangement. The LNA-mixer arrangement receives a plurality of input signals and provides a wide-band input match for a specified frequency range of operation. The LNA-mixer arrangement includes a plurality of LNA structures and a plurality of mixer structures and outputs at least a first signal. A current buffer arrangement receives the first signal and reduces the Image Rejection (IR) asymmetry between the high frequency portion and the low frequency portion of the first signal as well as provide a gain to the first signal. The current buffer arrangement outputs at least a second signal. An analog filter arrangement receives the second signals and perform filtering and calibrations.

According to another aspect of the invention, there is provided a method of performing the operations of a receiver. The method includes receiving a plurality of input signals and providing a wide-band input match for a specified frequency range of operation using a LNA-mixer arrangement. The LNA-mixer arrangement includes a plurality of LNA structures and a plurality of mixer structures and outputs at least a first signal. The method further includes receiving the first signal using a current buffer arrangement that reduces the Image Rejection (IR) asymmetry between the high frequency portion and the low frequency portion of the first signal as well as provide a gain to the first signal. The current buffer arrangement outputs at least a second signal. The method further includes providing an analog filter arrangement that receives the second signals and performs filtering and calibrations.

According to another aspect of the invention, there is provided a current buffer used in a receiver arrangement. The current buffer comprises a direct path mode and a mirror path mode. The direct path mode involves a plurality of first set of transistors and a plurality of first set of current sources that are turned on while all remaining transistors and current sources are turned off, during the direct path mode a current signal at an input node directly appears at an output node. The mirror path mode involves a first transistor and a first current source being turned off while a plurality of second set of transistors and a plurality of second set of current sources are turned on; wherein the current signal at the input node goes through a current mirror pair and appears at the output node with a gain that is controlled by slicing one of the transistors of the current mirror pair and a second current source allowing more than one gain in the mirror path mode.

These and other objectives of the present invention will no doubt become obvious to those of ordinary skill in the art after reading the following detailed description of the preferred embodiment that is illustrated in the various figures and drawings.

DETAILED DESCRIPTION

The invention provides a multimode multiband receiver which supports for example GSM/GPRS/EDGE, WCDMA/HSDPA/HSPA+, TDSCDMA, LTE-TDD/FDD/BW=1.4 MHz to 20 MHz. It has a programmable analog filter optimized for each of the modes separately to provide adequate blocker filtering before the analog-to-digital-conversion (ADC) in baseband circuitry. The RF front end has a plurality of low-noise-amplifier (LNA)/mixer paths whose outputs connect to a common pair of I/Q current buffers followed by the analog filter. A test tone generator (TTG) is used to feed a tone at mixer input to do IR calibration for each of the RF paths.

Figure 1:
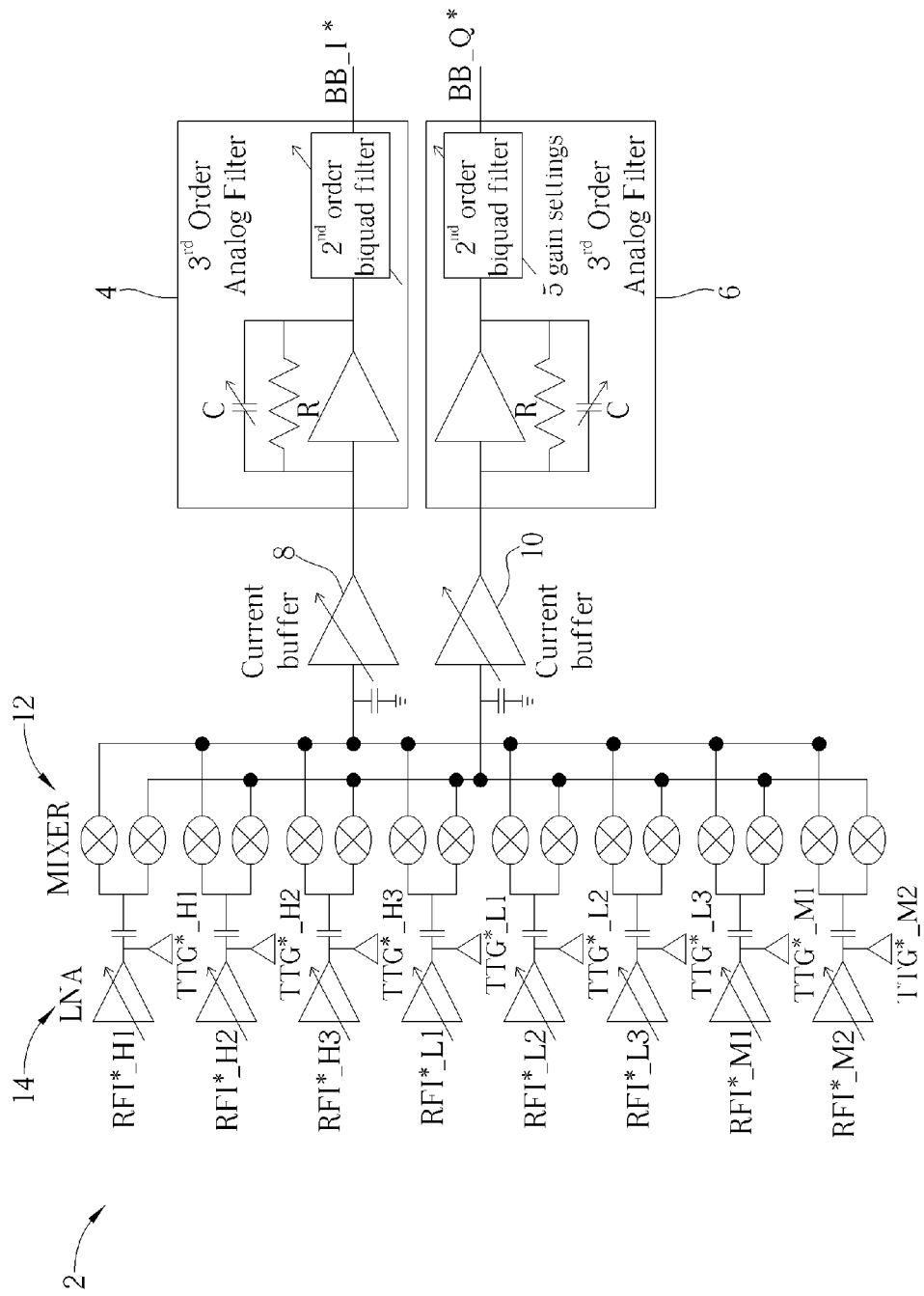
FIG. 1 is a schematic diagram illustrating an embodiment of the receiver used in accordance with the invention.

FIG. 1 shows the block diagram of an inventive receiver 2 according to an embodiment of the invention. The receiver 2 includes eight LNA 14 and mixer 12 paths whose outputs connect to a common pair of I/Q current buffers 8, 10 followed by the analog filters, 4, 6. In this embodiment, the LNA is a differential shunt feedback LNA with a push-pull core. The advantage with this architecture is the absence of inductors which makes it easily scalable with number of LNAs without a big area penalty and also reduces any coupling issues. It also provides a wide-band input match which gives a lot of flexibility to use a particular LNA path over a wide frequency range. Each of the LNAs 14 has 6 gain settings to better optimize the SNR vs. Headroom tradeoff in the automatic gain control (AGC) scheme. The lowest two gain settings are passive implementations with very good linearity to accommodate large blockers and high signal levels.

Figure 2:
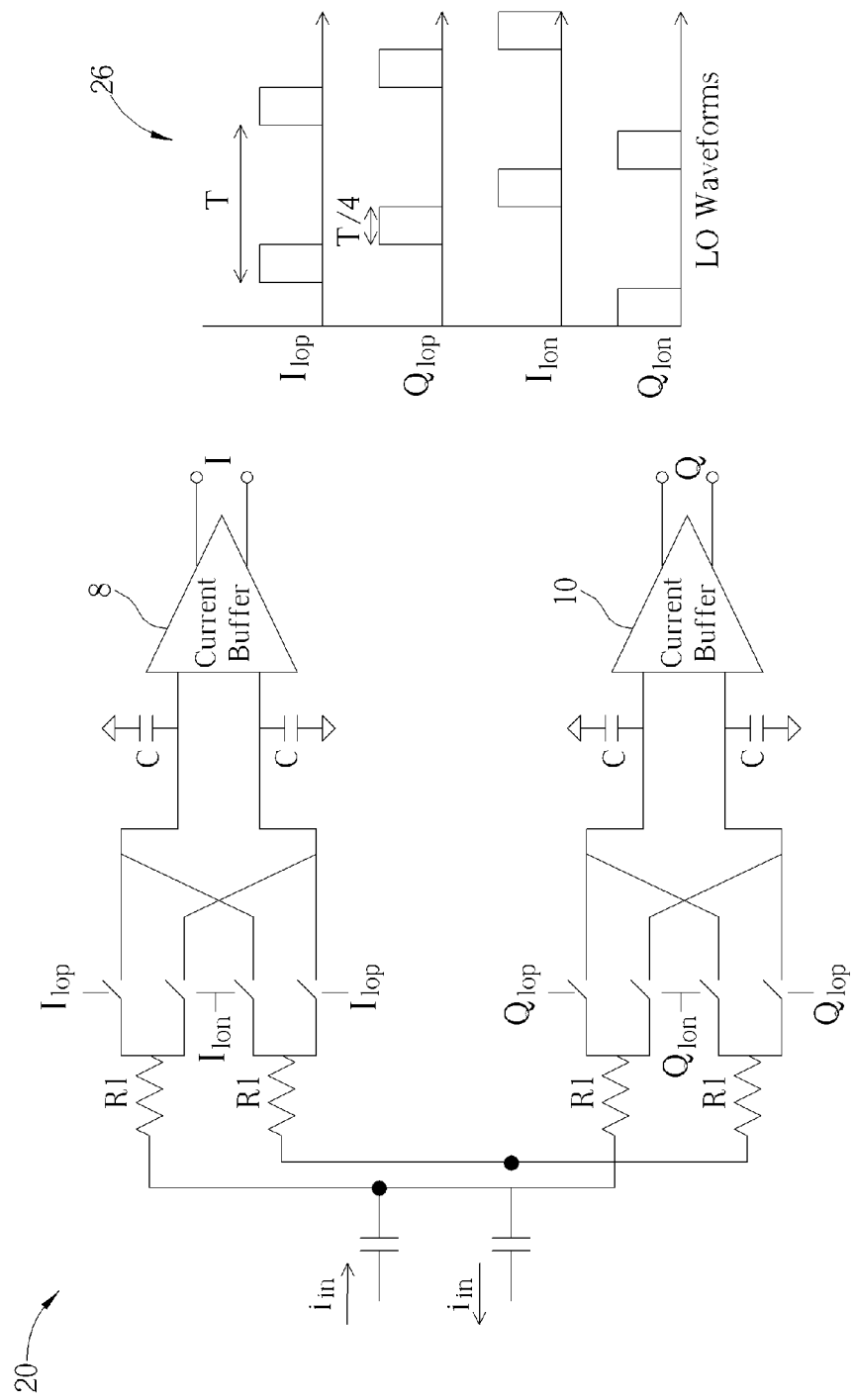
FIG. 2 is a schematic diagram illustrating an embodiment of the passive mixer architecture used in accordance with the invention.

The LNA output is AC coupled to drive RF current into a T/4 passive mixer with NMOS switches $I_{Ion}$-$I_{Iop}$, $Q_{Ion}$-$Q_{Iop}$, as shown in FIG. 2. The mixer switch size was optimized to obtain a good second-order intercept point (IIP2) at TX offset frequencies. The capacitances C on the mixer output nodes helps to reduce the signal/blocker swing and hence improves the linearity. The resistors R at the input of the mixer provide I/Q isolation and thus improve the IR performance of the receiver. However, they need to be carefully sized not to degrade the linearity.

The passive mixer architecture includes corresponding T/4 local oscillator (LO) waveforms 26. The mixer output interfaces with the current buffer (CB) 8, 10 which has a programmable gain. The CB 8, 10 helps to lower the high frequency side vs. low frequency side gain asymmetry. Another advantage of the CB 8, 10 is that it reduces the Image Rejection (IR) asymmetry between high frequency side vs. low frequency side. This helps in avoiding a multi-point frequency dependent IR calibration. If the mixer output were to interface with the analog filter directly, then the filter frequency response would see significant variation (for higher LTE signal BW modes) over process corners due to the large capacitance at the mixer output. The CB 8, 10 helps shield the analog filter 4, 6 from the mixer 12 and thus reduces the frequency response variation. The programmable gain range on the CB 8, 10 facilitates the LNA 14 to be in high gain for a higher signal range in the AGC and thus provides good SNR to support 64QAM modulation with high throughput.

There are gain settings implemented in the CB 8, 10 with two high gain setting modes (one direct path and one mirror path). The direct high gain path has a lower noise which can be used for very low input signal levels. The mirror path high gain setting has a better phase jump performance than the direct path when switching gain from high gain to a lower gain setting. With this kind of gain implementation, the lower CB gain settings will have a better noise performance than an input current steering approach to gain change thus helping the SNR for 64QAM modulation further.

Figure 3:
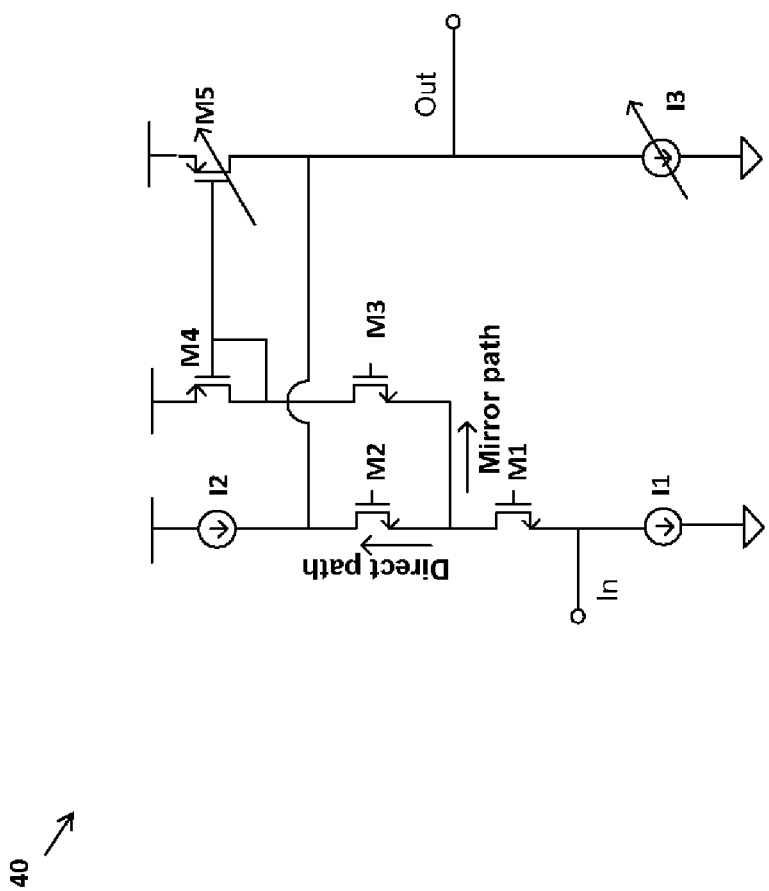
FIG. 3 is a schematic diagram illustrating an embodiment of the CB topology used in accordance with the invention.

FIG. 3 shows the CB topology 40 according to an embodiment of with the invention. The programmable gain on CB also helps lower the gain range needed on the analog filter 4, 6. The CB feeds a current into the analog filter. The CB 40 includes a direct path mode and mirror path mode. In the direct path mode, only transistors M1, M2 and current sources I1, I2 are turned on. The rest of the transistors and current source are turned off. During this mode, a current signal at the input node (In) directly appears at the output node (Out). This is the high gain mode for the CB 40.

In the mirror path mode, transistor M2 and current source I2 are turned off. Transistors M1, M3, M4, M5 and current sources I1, I3 are turned on. During this mode, the current signal at the input node (In) goes through the current mirror pair M4 and M5 and appears at the output node (Out) with gain controlled by slicing transistor M5 and current source I3. This is the low gain mode for the CB 40. One can achieve more than one gain in the mirror path mode by controlling the slicing numbers.

Figure 4:
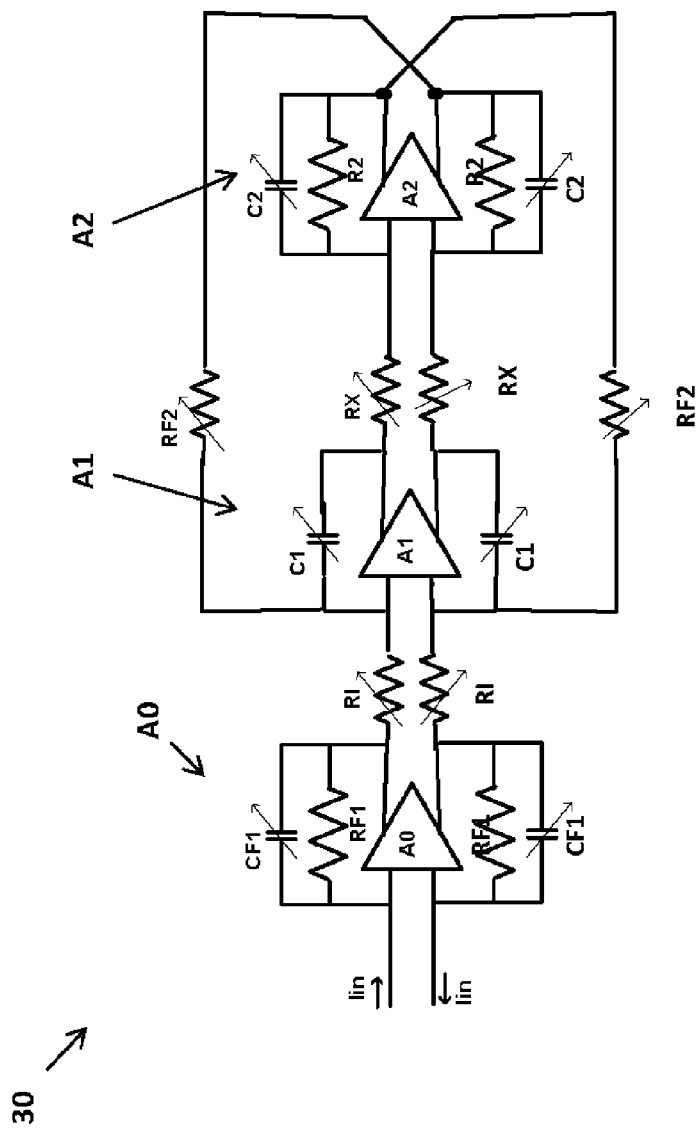
FIG. 4 is a schematic diagram illustrating an embodiment of the topology of the filter used in accordance with the invention.

FIG. 4 shows the topology 30 of the analog filter 4, 6 according to an embodiment of the invention. The first stage (A0) is a first order filter which acts like a trans-impedance amplifier (TIA). The last two stages (A1, A2) form a bi-quad structure. The resistance and capacitance of the TIA and the bi-quad structure are programmable with mode. This optimizes the filter for each mode separately and helps reduce the area. For each mode, the input resistance of the bi-quad structure, RI, changes with gain providing 5 gain settings with 3 dB steps. The A1 stage includes analog circuitry RX to do a digitally assisted RC calibration. The filter RC products are calibrated to +/−2% accuracy. The A1 stage also includes a current mode 6-bit DC offset DAC to do a DC offset calibration.

Although the present invention has been shown and described with respect to several preferred embodiments thereof, various changes, omissions and additions to the form and detail thereof, may be made therein, without departing from the spirit and scope of the invention.

What is claimed is:

1. A current buffer used in a receiver arrangement comprising:
    a direct path mode that includes a plurality of first set of transistors and a plurality of first set of current sources that are turned on while all remaining transistors and current sources are turned off, during the direct path mode a current signal at an input node directly appears at an output node; and
    a mirror path mode that includes a first transistor and a first current source being turned off while a plurality of second set of transistors and a plurality of second set of current sources are turned on; wherein the current signal at the input node goes through a current mirror pair and appears at the output node with a gain that is controlled by slicing one of the transistors of the current mirror pair and a second current source allowing more than one gain in the mirror path mode.

2. The current buffer of claim 1, wherein the direct path mode and mirror path mode are configured to provide programmable gain.

3. The current buffer of claim 1, wherein the mirror path mode provides one or more gain modes by controlling the slicing one of the transistors of the current mirror pair.

\* \* \* \* \*